United States Patent [19]
Atsumi et al.

[11] Patent Number: 5,901,083
[45] Date of Patent: May 4, 1999

[54] NONVOLATILE SEMICONDUCTOR MEMORY DEVICE

[75] Inventors: Shigeru Atsumi, Tokyo; Hironori Banba, Kawasaki, both of Japan

[73] Assignee: Kabushiki Kaisha Toshiba, Kawasaki, Japan

[21] Appl. No.: 08/939,876

[22] Filed: Sep. 29, 1997

Related U.S. Application Data

[63] Continuation of application No. 08/605,684, Feb. 22, 1996, abandoned, which is a continuation of application No. 08/179,126, Jan. 10, 1994, abandoned.

[30] Foreign Application Priority Data

Jan. 13, 1993 [JP] Japan .................................. 5-004305

[51] Int. Cl.⁶ .............................................. G11C 11/34
[52] U.S. Cl. ................................ 365/185.11; 365/230.06
[58] Field of Search .................................... 365/185, 218, 365/230.06, 230.03, 189.09, 189.11, 185.11

[56] References Cited

U.S. PATENT DOCUMENTS

| | | | |
|---|---|---|---|
| 4,642,798 | 2/1987 | Rao | 365/230 |
| 5,022,000 | 6/1991 | Terasawa et al. | 365/218 |
| 5,047,981 | 9/1991 | Gill et al. | 365/185 |
| 5,077,691 | 12/1991 | Haddad et al. | 365/218 |
| 5,122,985 | 6/1992 | Santin | 365/185 |
| 5,134,449 | 7/1992 | Gill et al. | 365/218 |
| 5,168,335 | 12/1992 | D'Arrigo et al. | 365/185 |
| 5,295,102 | 3/1994 | McClure | 365/230.06 |
| 5,295,106 | 3/1994 | Jinbo | 365/218 |
| 5,297,088 | 3/1994 | Yamaguchi | 365/230.06 |

FOREIGN PATENT DOCUMENTS

| | | |
|---|---|---|
| 0 525 678 A2 | 2/1993 | European Pat. Off. . |
| 0 550 751 A1 | 7/1993 | European Pat. Off. . |

OTHER PUBLICATIONS

Nakayama et al., "A New Decoding Scheme and Erase Sequence for 5V Only Sector Erasable Flash Memory", 1992 Symposium on VLSI Circuits, Digest of Technical Papers, Jun. 4–6, 1992, pp. 22–23.

Umezawa et al., "A 5–V–Only Operation 0.6–$\mu$ Flash EEPROM with Row Decoder Scheme in Triple–Well Structure", IEEE Journal of Solid–State Circuits, vol. 27, No. 11, Nov. 1992, pp. 1540–1545.

*Primary Examiner*—A. Zarabian
*Attorney, Agent, or Firm*—Banner & Witcoff, Ltd.

[57] ABSTRACT

A nonvolatile semiconductor memory device includes a row decoder circuit having first and second N-channel MOS transistors and first and second P-channel MOS transistors which correspond to each of word lines. One end of a source-to-drain current path of the first N-channel MOS transistor is connected to the word line, and the other end thereof is connected to a corresponding one of output terminals of a predecoder circuit. One end of a source-to-drain current path of the second N-channel MOS transistor is connected to the word line, and the other end thereof is supplied with a voltage of 0 V or more in a data erase mode and is supplied with a low logical level signal in modes other than the data erase mode. A source-to-drain current path of the first P-channel MOS transistor is connected in parallel to the source-to-drain current path of the first N-channel MOS transistor, and a source-to-drain current path of the second P-channel MOS transistor is connected in parallel to the source-to-drain current path of the second N-channel MOS transistor.

39 Claims, 6 Drawing Sheets

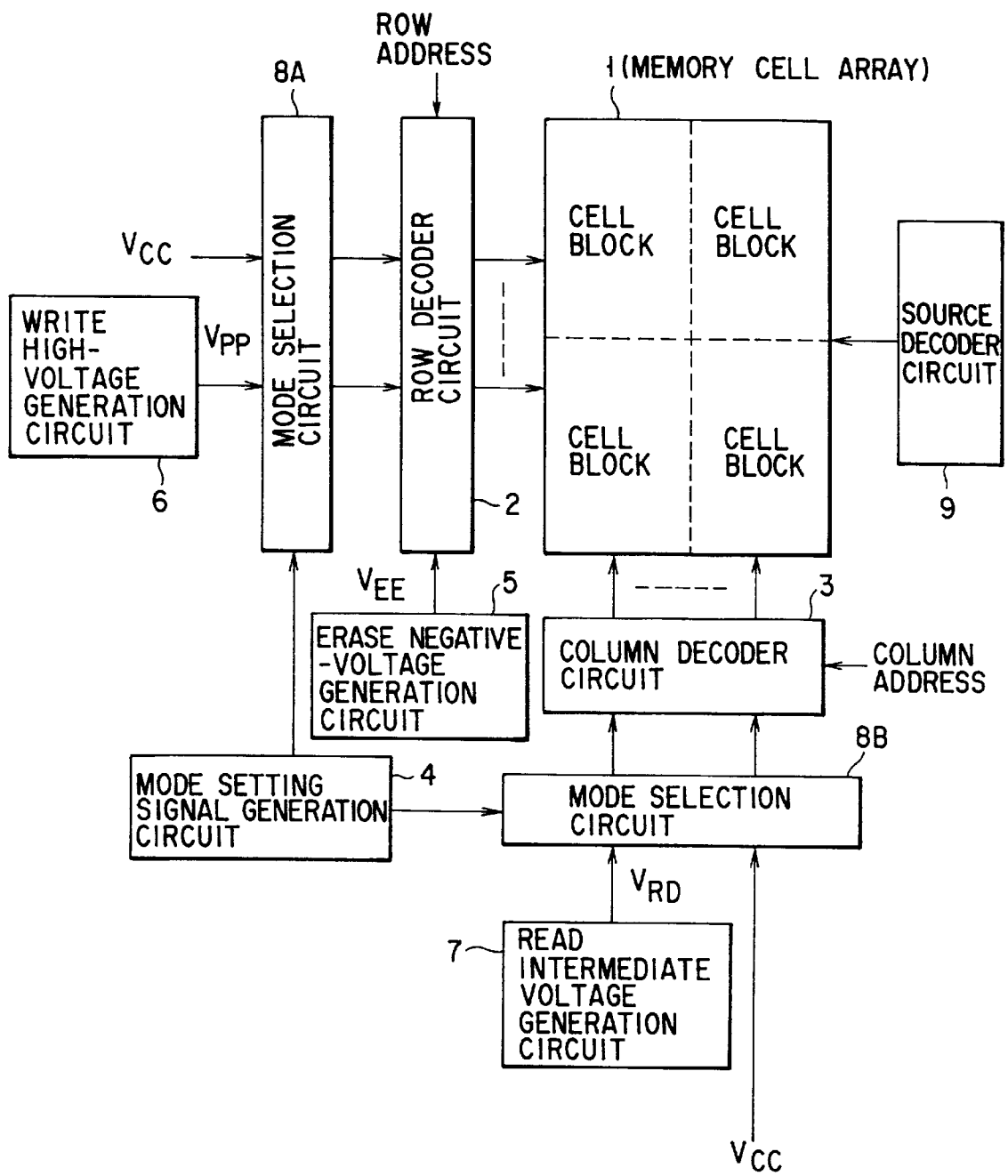
F I G. 1

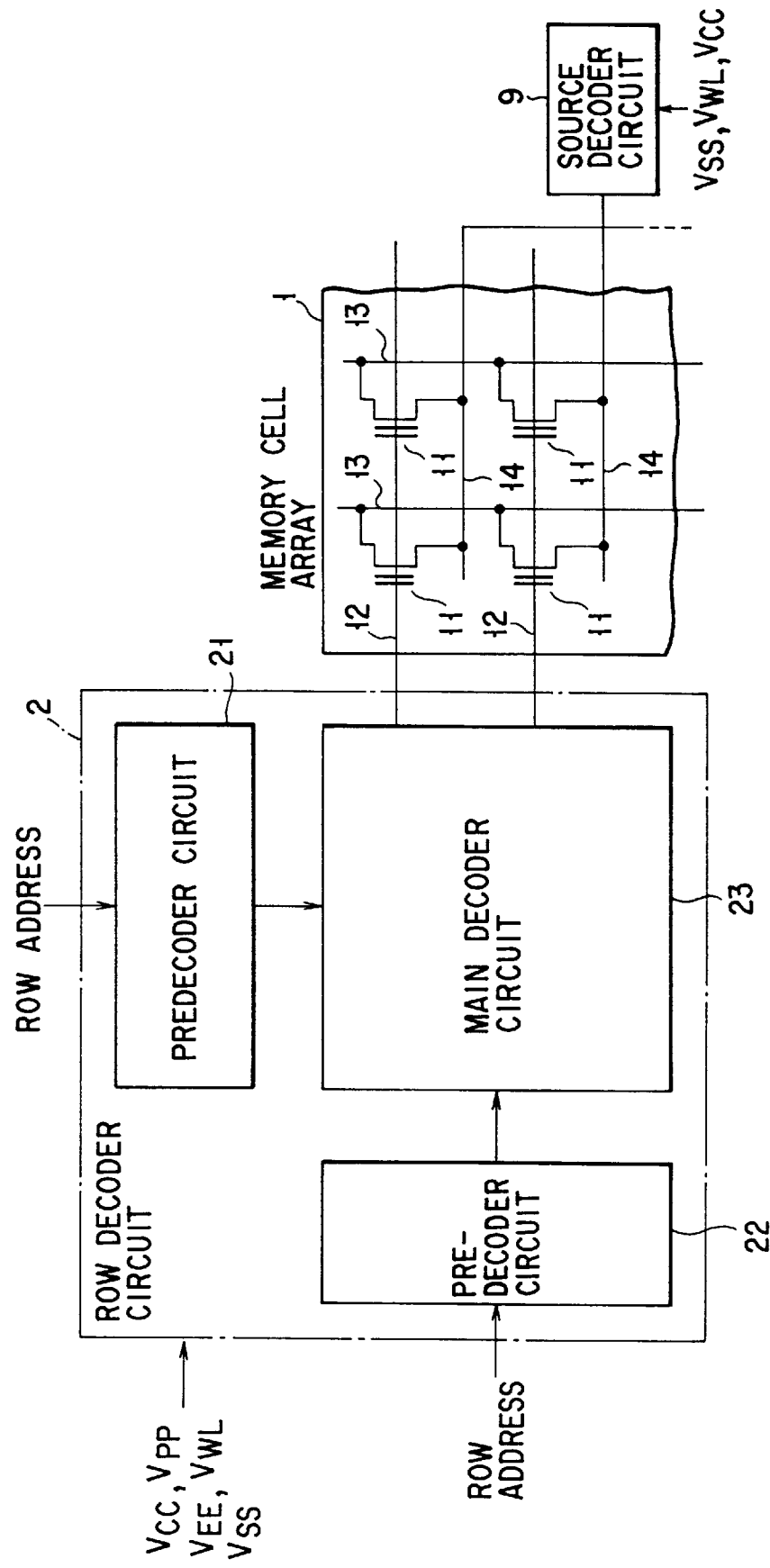
F I G. 2

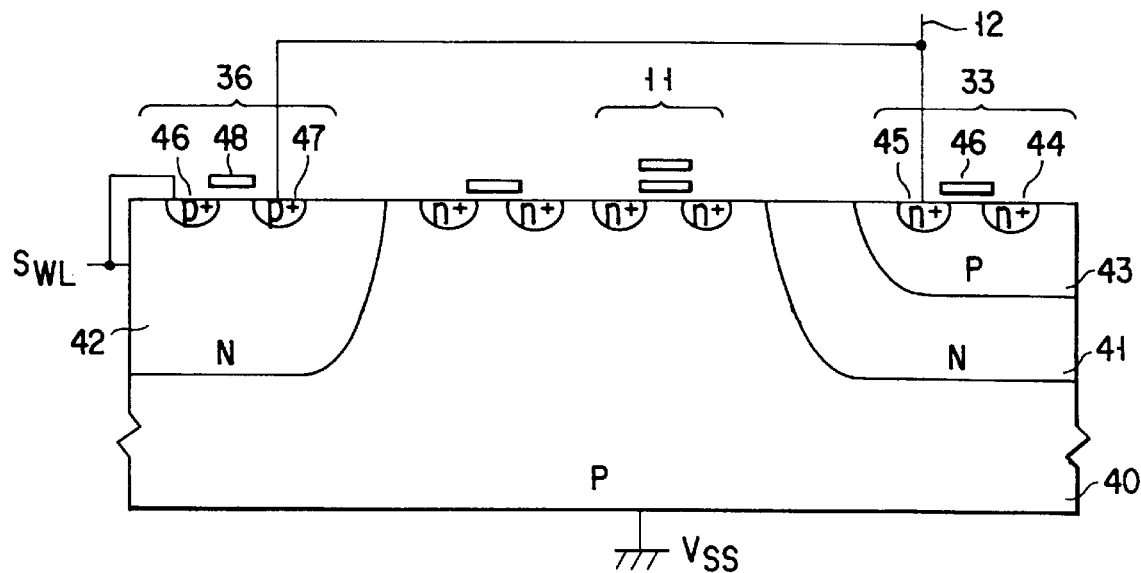
F I G. 4
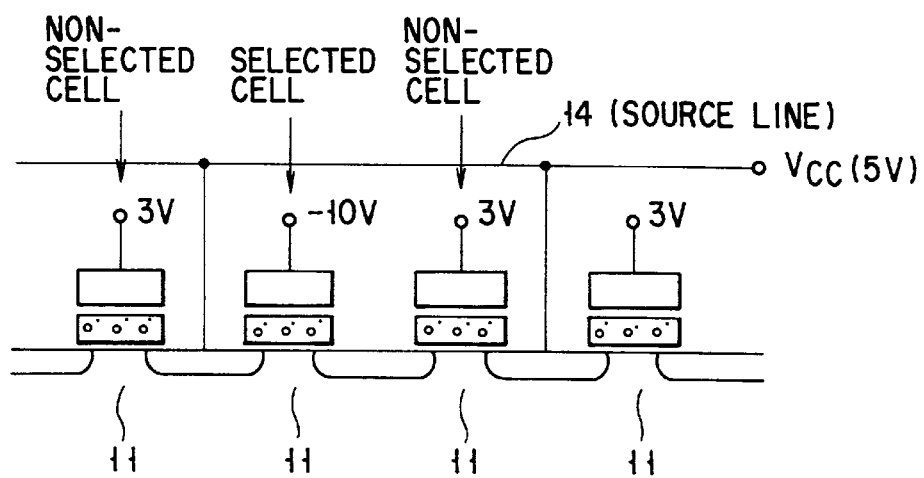
F I G. 5

NONVOLATILE SEMICONDUCTOR MEMORY DEVICE

This application is a continuation of application Ser. No. 08/605,684, filed Feb. 22, 1996, now abandoned, which is a continuation of Ser. No. 08/179,126, filed Jan. 10, 1994, now abandoned.

BACKGROUND OF THE INVENTION

1. Field of the Invention

The present invention relates to a nonvolatile semiconductor memory device which is electrically erasable and programmable and, more particularly, to an EEPROM capable of erasing data in a small unit.

2. Description of the Related Art

A flash EEPROM, which is one type of EEPROM and capable of electrically erasing data at once, includes a stacked memory cell transistor. The writing of data to the flash EEPROM is performed by injecting channel hot electrons, and the erasing of data therefrom is done by causing a Fowler-Nordheim tunnel current to flow. In this memory device, it is clearly effective to apply a negative voltage to the gate of the memory cell transistor when data is erased; therefore, a row decoder circuit for applying a negative voltage to a word line when data is erased, is required.

In the conventional EEPROM, all bits are erased at once or data is erased for each block of a large unit, but data cannot be erased for each block of a small unit.

Recently, a memory device capable of erasing data in a small unit has been developed, as is proposed in H. Kume et al., "A 3.42 $\mu m^2$ Flash Memory Cell Technology Conformable to a Sector Erase," *Symposium on VLSI Technology*, 1991, pp 77–78. In this memory device, an erase block is designated for every word line, a negative voltage is applied to only the word lines of a block to be erased, and a high voltage of, e.g., 5 V is applied to the sources of all memory cell transistors. The word lines of non-selected blocks are set in a semi-selected mode, and a positive voltage lower than the source potential is applied to the word lines in order to prevent data from being erased by mistake.

In other words, a low voltage is applied to the gate of a non-selected memory cell, and a difference in potential between the source and gate thereof is reduced, thereby preventing so-called soft erase from being caused in the non-selected memory cell.

According to the memory device described above, only the selected word line has to be set to a low level (negative voltage) and the non-selected word line has to be set to a high level (positive voltage) in the erase mode, contrary to the read and write modes, and a row decoder circuit having such a voltage setting function is therefore needed.

Conventionally, two types of row decoder circuits, that is, a read/write type positive-voltage decoder and an erase type negative-voltage decoder consisting of a P-channel MOS transistor are arranged for each word line. A negative voltage is supplied from a negative-voltage supply circuit to the respective negative-voltage decoders. The positive-voltage decoder and the negative-voltage decoder of each row are separated from each other by interposing a negative-voltage stopping P-channel MOS transistor between them.

Since the two decoders have to be arranged for each word line as described above, the number of transistors constituting the row decoder circuit is increased, with the result that the area of the row decoder circuit occupied in an integrated circuit is greatly increased and the size of a chip is also increased.

A great voltage stress is applied to the negative-voltage stopping P-channel MOS transistor. For this reason, a gate oxide film of the MOS transistor has to be made thicker than the other circuit elements, which complicates a manufacturing process.

SUMMARY OF THE INVENTION

It is an object of the present invention to provide a nonvolatile semiconductor memory device comprising a row decoder circuit which is simpler in constitution than that of a conventional device.

According to the present invention, there is provided a nonvolatile semiconductor memory device comprising:

a memory cell array including a plurality of memory cells arranged in rows and columns and each having a transistor having a source, a drain and a gate and capable of electrically erasing and rewriting data;

a plurality of word lines to which gates of the plurality of memory cells arranged in the same row of the memory cell array are connected in common;

a plurality of bit lines to which drains of the plurality of memory cells arranged in the same column of the memory cell array are connected in common; and word line selection means for selecting one of the plurality of word lines in accordance with address information, applying a first voltage having a negative value to the selected one of the plurality of word lines in a data erase mode, and applying a second voltage of a positive value to each of non-selected word lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the entire constitution of an EEPROM according to a first embodiment of the present invention;

FIG. 2 is a circuit diagram showing a constitution of part of a memory cell array and that of part of a row decoder circuit both included in the EEPROM of FIG. 1;

FIG. 4 is a cross-sectional view showing a device structure of part of the main decoder circuit of FIG. 3;

FIG. 5 is a circuit diagram of the EEPROM shown in FIG. 3 from which data is erased;

DETAILED DESCRIPTION OF THE PREFERRED EMBODIMENTS

Figure 3:
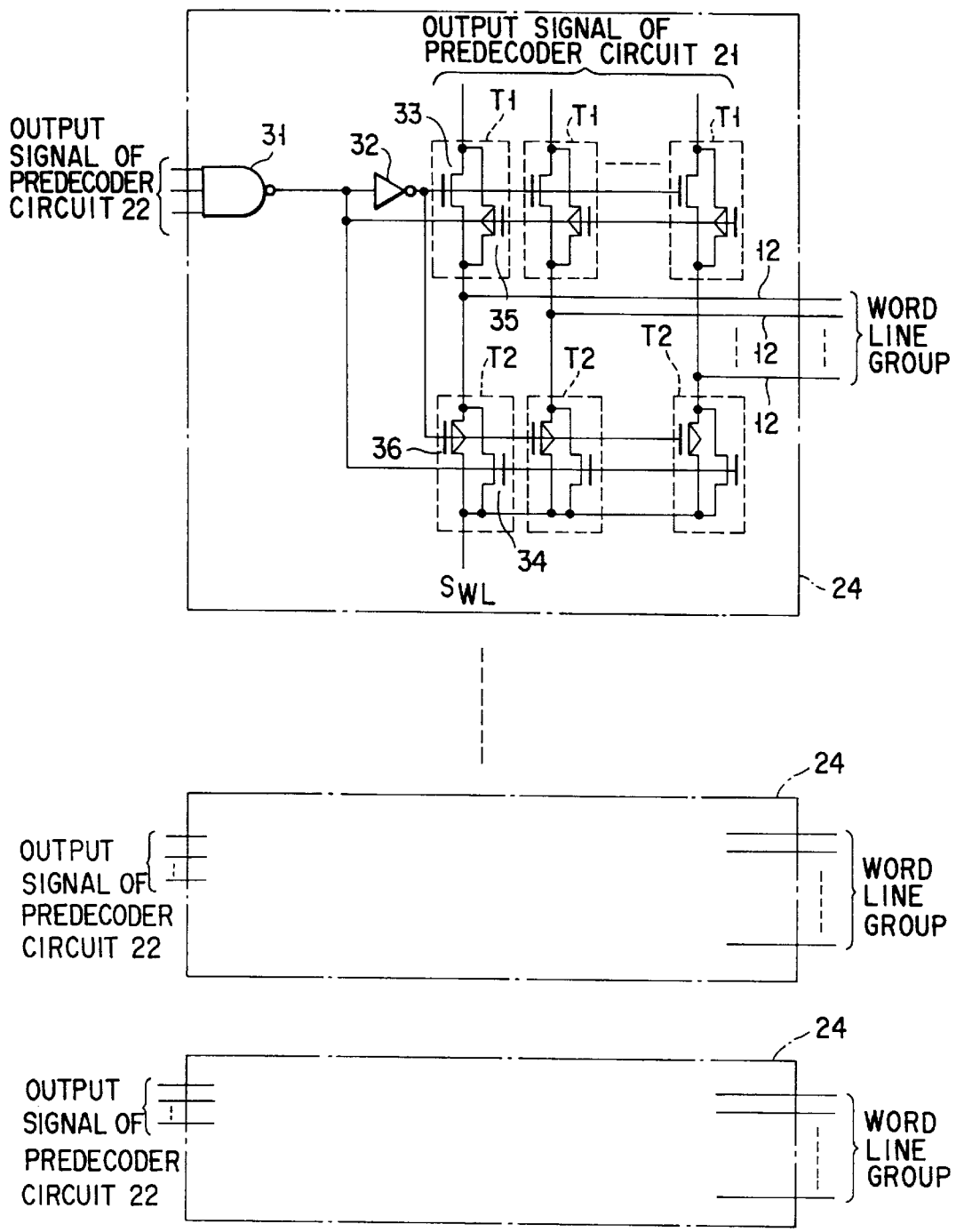
FIG. 3 is a circuit diagram showing in detail a main decoder circuit of the row decoder circuit of FIG. 2.

Embodiments of the present invention will now be described, with reference to the accompanying drawings.

FIG. 1 shows an EEPROM according to a first embodiment of the present invention. The EEPROM comprises a memory cell array 1, row decoder circuit 2, a column decoder circuit 3, a mode setting signal generation circuit 4, an erase negative-voltage generation circuit 5, a write high-voltage generation circuit 6, a read intermediate-voltage generation circuit 7, mode selection circuits 8A and 8B, and a source decoder circuit 9.

The memory cell array 1 includes a number of stacked memory cell transistors each of which has a floating gate and a control gate and which are arranged in rows and columns, though they are not shown. The memory cell array 1 is divided into plural cell blocks (four cell blocks in the first embodiment), and the memory cell transistors of each cell block have a source in common.

The row decoder circuit 2 selects memory cell transistors of one row from all the memory cell transistors arranged in the memory cell array 1 in accordance with a row address. Similarly, the column decoder circuit 3 selects memory cell transistors of one column therefrom in accordance with a column address.

The mode setting signal generation circuit 4 generates a mode setting signal according to an operation mode of the EEPROM. The operation mode includes a data erase mode, a data write mode, and a data read mode.

The erase negative-voltage generation circuit 5, the write high-voltage generation circuit 6, and the read intermediate-voltage generation circuit 7 generate an erase negative voltage VEE, a write high voltage VPP, and a read intermediate voltage VRD, respectively, and these voltages are used in the memory cell array in the data erase, data write, and data read modes, respectively.

The mode selection circuits 8A and 8B receive the mode setting signal from the mode setting signal generation circuit 4, and selects their respective voltages to be used in the row decoder circuit 2 and column decoder circuit 3 in the data erase, data write, and data read modes.

The source decoder circuit 9 applies a predetermined voltage to the source common to the memory cell transistors of each cell block in the memory cell array 1.

In addition, the EEPROM includes a voltage generation circuit for generating a voltage which is lower than a power supply voltage to be applied to the gate of a non-selected memory cell transistor in the data erase mode.

FIG. 2 shows part of one cell block of the memory cell array 1 as well as the row decoder circuit 2 and source decoder circuit 9. The cell block includes a number of stacked memory cell transistors 11 arranged in rows and columns. The control gates of the memory cells 11 arranged in the same row are connected in common to each of word lines 12. The drains of the memory cells 11 arranged in the same column are connected in common to each of bit lines 13. The sources of the memory cell transistors 11 are connected in common to a source line 14, and a voltage is applied from the source decoder circuit 9 to the source line 14.

The row decoder circuit 2 comprises a predecoder circuit 21 to which some of row addresses are input, a predecoder circuit 22 to which some of the row addresses other than those input to the circuit 21 are input, and a main decoder circuit 23 to which output signals of the predecoder circuits 21 and 22 are supplied. In addition to a normal power supply voltage VCC of 5 V, a negative voltage VEE of, e.g., about −10 V generated by the erase negative-voltage generation circuit 5, a high voltage VPP of, e.g., about 12 V generated by the write high-voltage generation circuit 6, a voltage VWL of, e.g., 3 V, which is lower than the power supply voltage VCC and is applied to the gate of a non-selected memory cell transistor in the erase mode, and a ground voltage VSS of 0 V, are applied to the row decoder circuit 2. The above voltages VCC, VWL and VSS are also applied to the source decoder circuit 9, and one of these voltages is output to the source line 14 in the corresponding cell block.

In the memory cell array 1, in the read mode, the power supply voltage VCC (5 V) is applied to a selected one of the word lines (selected word line) 12, and a read intermediate voltage VRD of, e.g., about 1 V, which is generated by the read intermediate-voltage generation circuit 7, is applied to a selected one of the bit lines (selected bit line) 13. In the write mode, the write high voltage VPP (12 V) is applied to the selected word line 12, and a high voltage is applied to the selected bit line 13, too. In the erase mode, the power supply voltage VCC is applied to the source line 14, the negative voltage VEE is applied only to the selected word line 12, and the voltage VWL (3 V) is applied to a non-selected word line. The bit lines 13 are rendered in, for example, a floating state.

The main decoder circuit 23 of the row decoder circuit 2 decodes outputs of the predecoder circuits 21 and 22, and applies predetermined voltages to the selected word line and non-selected word line, respectively. FIG. 3 shows a circuit arrangement of part of the main decoder circuit 23.

The main decoder circuit 23 includes decoder circuits 24 for every word line group having the same number of word lines. Each of the decoder circuits 24 includes a CMOS type NAND gate 31 supplied with decode signals which are different combinations of signals output from the predecoder circuit 22, a CMOS type inverter 32 for inverting an output signal of the NAND gate 31, N-channel MOS transistors 33 and 34 and P-channel MOS transistors 35 and 36 which correspond to each of the word lines 12 within the word line group.

The source-to-drain current paths of the N- and P-channel MOS transistors 33 and 35 corresponding to the same word line 12 are connected in parallel to each other. One end of each of the source-to-drain current paths is supplied with a signal output from its corresponding one of plural decode output terminals of the predecoder circuit 21, and the other ends thereof are connected to their corresponding word line 12. The decode output terminals of the predecoder circuit 21 output the voltage VCC or VPP when a word line corresponding to the read or write mode is selected, and output the ground voltage of 0v when it is not selected. Further, the decode output terminals output the voltage VEE when a word line corresponding to the erase mode is selected, and output the voltage VWL when it is not selected.

The source-to-drain current paths of the other N- and P-channel MOS transistors 34 and 36 are also connected in parallel to each other. One end of each of the source-to-drain current paths is connected to a node to which a predetermined voltage SWL is applied, and the other ends thereof are connected to their corresponding word line 12.

The voltage SWL is changed to the voltage VWL in the erase mode, and to the ground voltage VSS in the other modes.

The gates of the P-channel MOS transistors 35 connected to the respective word lines 12 are supplied with a common output signal of the NAND gate 31, and the gates of the N-channel MOS transistors 33 are supplied with a common output signal of the inverter 32. Similarly, the gates of the N-channel MOS transistors 34 connected to the respective word lines 12 are supplied with a common output signal of the NAND gate 31, and the gates of the P-channel MOS transistors 36 are supplied with a common output signal of the inverter 32. In other words, each N-channel MOS transistor 33 and each P-channel MOS transistor 35 constitute a CMOS transfer gate (CMOS switch) T1, and each N-channel MOS transistor 34 and each P-channel MOS transistor 36 constitute a CMOS transfer gate (CMOS switch) T2.

The two transfer gates T1 and T2 are so controlled as to supply the decode signal or voltage SWL from the predecoder circuit 21 to their corresponding word line 12 in response to the output signal of the NAND gate 31.

FIG. 4 is a cross-sectional view showing a device structure of part of the memory cell array 1 shown in FIG. 2 which includes the N-channel MOS transistor 33 and P-channel MOS transistor 36 shown in FIG. 3. The ground voltage VSS of 0 V is applied to a P-type semiconductor substrate 40 of the device structure, and N wells 41 and 42 are formed in the substrate 40. These N wells can be formed simultaneously by the same process or separately by different processes. For example, the N well 41 is formed first to have a great junction depth xj, and then a P well 43 is formed therein. Such a double well structure of the N and P wells 41 and 43 allows the P well 43 to be electrically separated from the P-type semiconductor substrate 40.

The N-channel MOS transistor 33 is formed in the P well 43. More specifically, the source 44 and drain 45 of the N-channel MOS transistor 33 are formed in the P well 43, and the gate 46 thereof is formed above the surface of the P well 43. Various voltages which include a negative voltage and are output from the output terminals of the predecoder circuit 21 shown in FIG. 2, are applied to the source 44 of the N-channel MOS transistor 33. The drain 45 is connected to its corresponding one of the word lines 12. The gate 46 is supplied with an output of the inverter 32 shown in FIG. 3. The negative voltage VEE is applied to the P well 43 in the erase mode, and the ground voltage of 0 V is applied thereto in the other modes.

The P-channel MOS transistor 36 is formed in the N well 42. More specifically, the source 46 and drain 47 of the P-channel MOS transistor 36 are formed in the N well 42, and the gate 48 thereof is formed above the surface of the N well 42. The power supply voltage SWL is applied to the source 46 and N well 42. The drain 47 is connected to the word line 12 to which the drain 45 of the N-channel MOS transistor 33 is connected. The gate 48 is supplied with an output of the inverter 32 shown in FIG. 3.

The N- and P-channel MOS transistors 34 and 35 shown in FIG. 3 have the same structures as the above-described N- and P-channel MOS transistor 33 and 36 do, respectively.

The memory cell transistor 11, NAND gate 31, and N-channel MOS transistor are formed in the P-type semiconductor substrate 40. The memory cell transistor 11 is formed in the substrate 40 in order to prevent the substrate potential of the memory cell transistor 11 from being floated when a substrate current flows in the write mode.

An operation of the main decoder circuit 23 including the decoder circuits 24, shown in FIG. 3, will now be described.

In the read, write, and erase modes, the NAND gate 31 in the decoder circuit 24 to which a word line group including a selected word line 12 is connected, is supplied with high-level decode signals from the corresponding predecoder circuit 22, and the output signal of the NAND gate 31 becomes logic low level. Moreover, the output signal of the inverter 32 to which the output signal of the NAND gate 31 is input, becomes logic high level. Thus, each transfer gate T1 connected to its corresponding word line 12, is turned on.

At least one of the decode signals supplied from the predecoder circuit 22 to the NAND gates 31 in the other decoder circuits 24, is at a logic low level. Therefore, in the decoder circuits 24 to which the word line groups including no selected word line 12 are connected, the output signal of the NAND gate 31 becomes logic high level, and that of the inverter 32 becomes low, with the result that the transfer gates T2 are turned on in these decoder circuits 24.

In the read mode, the predecoder circuit 21 for applying a voltage to one end of each transfer gate T1 outputs the voltage VCC of 5 V only from its output terminal corresponding to the selected word line 12 based on an address, and outputs the ground voltage VSS of 0 V from its output terminal corresponding to the non-selected word lines 12. In other words, the voltage VCC of 5 V is applied only to the selected word line 12, and the voltage VSS of 0 V is applied to the other non-selected word lines 12. In this time, the voltage SWL applied to each transfer gate T2 is changed to the ground voltage VSS of 0 V, and the decoder circuits 24 connected to the word line groups not including the selected word line, apply the ground voltage VSS of 0 V to the respective word lines through the transfer gates T2.

In the write mode, the predecoder circuit 21 outputs the high voltage VPP of 12 V from its output terminal corresponding to the selected word line 12, and outputs the ground voltage VSS of 0 V from its output terminal corresponding to the non-selected word lines 12. In other words, the voltage of 12 V is applied only to the selected word line 12, and the ground voltage VSS of 0 V is applied to the other non-selected word lines 12. In this time, the voltage SWL applied to each transfer gate T2 is changed to the ground voltage VSS of 0 V, and the decoder circuits 24 connected to the word line groups not including the selected word line, apply the ground voltage VSS of 0 V to the respective word lines through the transfer gates T2.

In the erase mode, the predecoder circuit 21 outputs the negative voltage VEE of −10 V from its output terminal corresponding to the selected word line 12, and outputs the voltage VWL of 3 V from its output terminal corresponding to the non-selected word lines 12. Furthermore, the transfer gates T2 of the decoder circuits 24 to which the word line groups not including the selected word line, are turned on and, in this time, the power supply SWL connected to the transfer gates T2 is set to the voltage VWL of 3 V. In other words, the decoder circuits 24 to which the word line groups not including the selected word line 12, apply the voltage VWL of 3 V to the word lines 12. Further, in the erase mode, the voltage VCC of 5 V is output from the source decoder circuit 9.

An operation of the EEPROM in the erase mode will be described, with reference to FIG. 5. As shown in FIG. 5, the voltage VEE of −10 V is applied to the control gate of one of the plural memory cell transistors 11 which is connected to the selected word line 12, while the voltage VWL of 3 V is applied to the control gates of the other memory cell transistors connected to the non-selected word lines 12. The voltage VCC of 5 V is applied to the source line 14.

In a selected memory cell transistor (selected cell) whose control gate is supplied with the voltage VEE of −10 V, the potential of the floating gate is set to a negative value corresponding to the voltage VEE, by the voltage applied to the control gate, the Fowler-Nordheim tunnel current is caused to flow between the floating gate and source by applying a great electric field between them, and the electrons stored in advance in the floating gate are emitted to the source, thereby erasing data.

In the non-selected memory cell transistors (non-selected cells), the voltage of 3 V and the voltage of 5 V are applied to the control gate and the source, respectively, and the electric field generated between the floating gate and control gate is weaker than in the selected memory cell. For this reason, no soft erase occurs in the non-selected cells.

The circuit arrangement of the predecoder circuit 21, which applies various types of voltages to the transfer gates T1 shown in FIG. 3, will now be described in detail.

Figure 6:
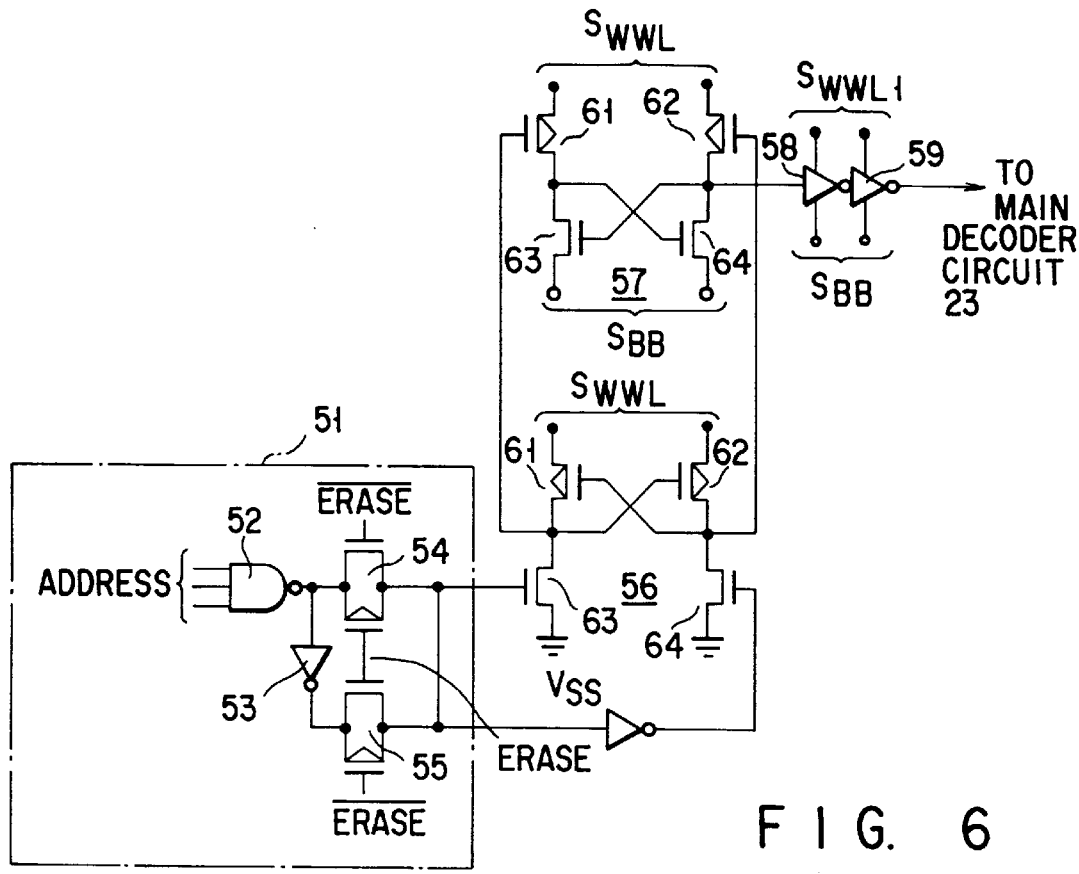
FIG. 6 is a circuit diagram showing in detail part of a predecoder circuit of the row decoder circuit of FIG. 2.

The predecoder circuit 21 has output terminals which are equal in number to the word lines of each word line group, and also has decode/level conversion circuits which are equal in number to the output terminals. FIG. 6 shows a decode/level conversion circuit corresponding to one of the output terminals of the predecoder circuit 21. In FIG. 6, reference numeral 51 denotes a decoder for decoding an address, and reference numeral 52 indicates a NAND gate to which a plurality of address signals is input. By using an inverter 53 and two transfer gates 54 and 55 whose conduction is controlled in response to erase mode signals "erase" and "erase", the outputs of the NAND gate 52 are supplied from the decoder 51 as complementary signals whose logical levels are inverted in the erase mode and the other modes. The levels of VCC (5 V) signals output from the decoder 51 are changed in sequence to different ones by two level shifters 56 and 57 and two CMOS inverters 58 and 59, and the signals whose levels have been changed, are supplied to the main decoder circuit 23 shown in FIG. 3.

The level shifters 56 and 57 are each constituted by P-channel MOS transistors 61 and 62 and N-channel MOS transistors 63 and 64. A voltage SWWL is applied to the sources of the P-channel MOS transistors 61 and 62 of the level shifter 56, and a ground voltage VSS is applied to the sources of the N-channel MOS transistors 63 and 64 thereof. On the other hand, a voltage SWWL is applied to the sources of the P-channel MOS transistors 61 and 62 of the level shifter 57, and a voltage SBB is applied to the sources of the N-channel MOS transistors 63 and 64 thereof. Furthermore, a voltage SWWL1 and voltage SBB are applied to the CMOS inverters 58 and 59. The voltage SWWL is changed to the voltage VCC (5 V) in the read mode and to the voltage VPP (12 V) in the write mode. The voltage SBB is usually the voltage VSS (0 V) and changed to the voltage VEE (−10 V) in the erase mode. The voltage SSWW1 is basically equal to the voltage SWWL and changed to the voltage of 3 V in the erase mode.

Consequently, the levels of the VCC signals decoded by the decoder 51, are changed in sequence to SWWL to VSS voltages by the level shifter 56, to SWWL to SBB voltages by the level shifter 57, and to SWWL to SBB voltages by the inverters 58 and 59.

Figure 7:
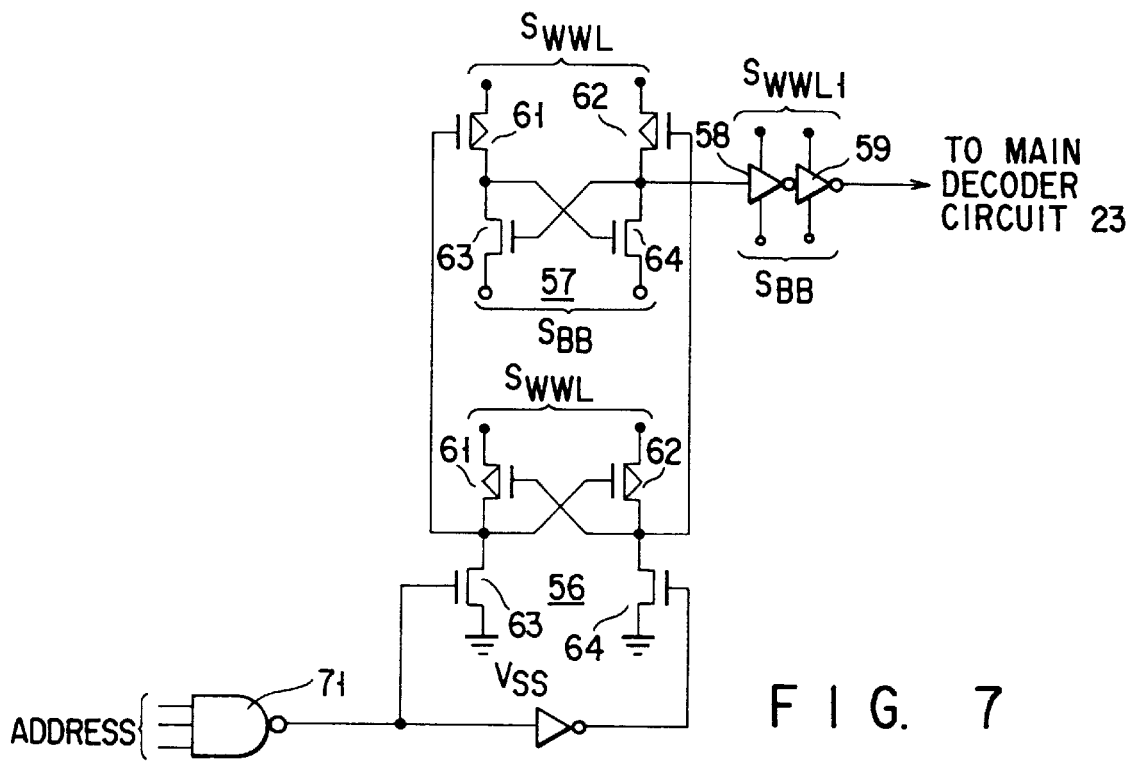
FIG. 7 is a circuit diagram showing a constitution of part of the predecoder circuit of FIG. 6.

The predecoder circuit 22 shown in FIG. 2, which supplies a signal to the NAND gate 31 in the decoder circuit 24 shown in FIG. 3, has a plurality of output terminals, and also has decode/level conversion circuits which are equal in number to the output terminals. FIG. 7 shows a circuit arrangement of one of the decode/level conversion circuits, which is the same as shown in FIG. 6, except that a NAND gate 71 is formed in place of the decoder 51 shown in FIG. 6. The predecoder circuit 22 always outputs a high-level voltage from a selected one of the output terminals and a low-level voltage from the non-selected output terminals. These high- and low-level voltages are, as in the case with FIG. 6, output as SWWL1 to SBB voltages, by using two level shifters 56 and 57 and two CMOS inverters 58 and 59. It is thus necessary to operate the NAND gate 31 and inverter 32 shown in FIG. 3 with the SWWL1 and SBB voltages.

In the EEPROM having the above arrangement, data can be erased for each word line by applying a negative voltage to a single word line in the erase mode and, unlike the conventional EEPROM, two different row decoders of the positive and negative voltage decoders need not be arranged. Furthermore, unlike the conventional EEPROM, the positive and negative voltage decoders need not be separated from each other in each row by interposing the negative voltage stopping P-channel MOS transistor between them. As a result, the number of the transistors constituting the row decoder circuit can be decreased, the area of the row decoder circuit occupied in an integrated circuit can be reduced, and the size of a chip can also be reduced, as compared with the conventional EEPROM.

In the above embodiment, the single word line 12 is selected, and data is erased for each row. If the row decoder circuit is modified so that all the word lines in the cell block are selected at the same time, data can be erased in a larger unit.

Figure 8:
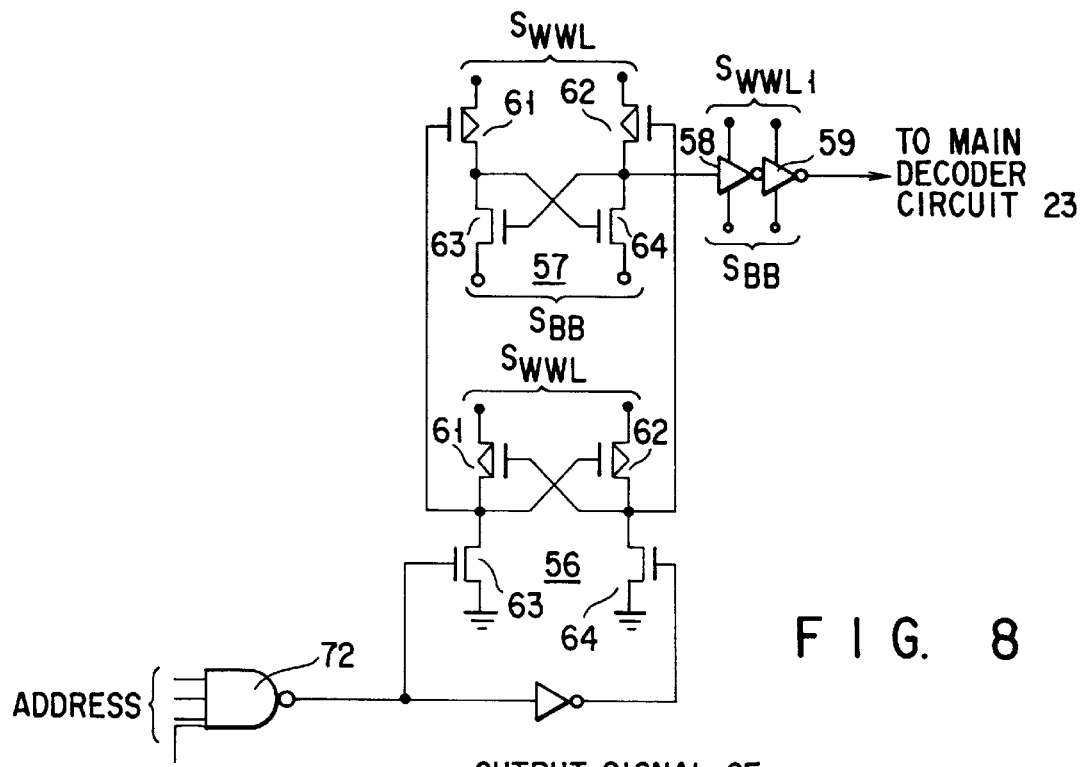
FIG. 8 is a circuit diagram showing a constitution of part of a modification to the EEPROM according to the first embodiment.

FIG. 8 is a circuit diagram showing a modification to the EEPROM according to the first embodiment described above. In this EEPROM, a NAND gate 72 is used in place of the decoder 51 shown in FIG. 6. The NAND gate 72 is supplied with an erase mode signal erase as well as an address signal. In the EEPROM shown in FIG. 8, the output signals of the predecoder circuit 21 are all changed to negative voltages, the negative voltage are applied to all the word lines in the cell block, thereby erasing data in the cell block at once.

Figure 9:
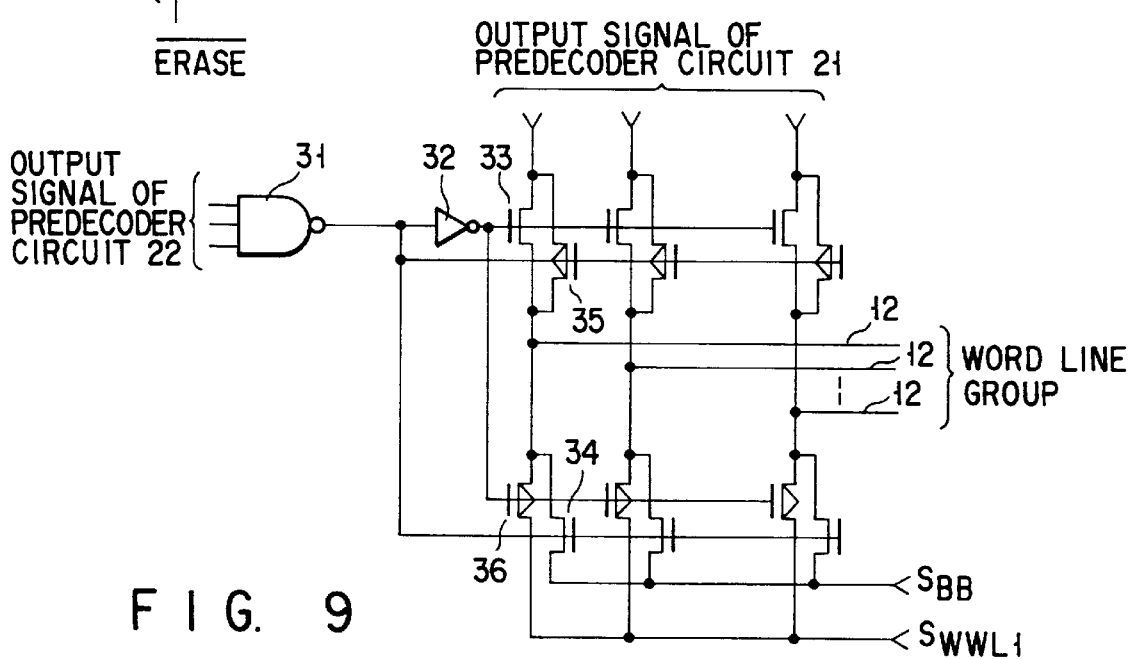
FIG. 9 is a circuit diagram showing a constitution of part of an EEPROM according to a second embodiment of the present invention.

FIG. 9 is a circuit diagram showing a constitution of part of a main decoder circuit of an EEPROM according to a second embodiment of the present invention. In the above first embodiment, the source-to-drain current paths of the N- and P-channel MOS transistors 34 and 36 are connected in parallel to each other, one end of each of the source-to-drain current paths is connected to its corresponding word line, and the other ends of these current paths are connected in common to the voltage SWL. According to the second embodiment, one end of each source-to-drain current path of the N- and P-channel MOS transistors 34 and 36 is connected to its corresponding word line 12, the other end of the source-to-drain current path of the N-channel MOS transistor 34 is connected to the voltage SBB, and the other end of the source-to-drain current path of the P-channel MOS transistor 36 is connected to the voltage SWWL1.

Figure 10:
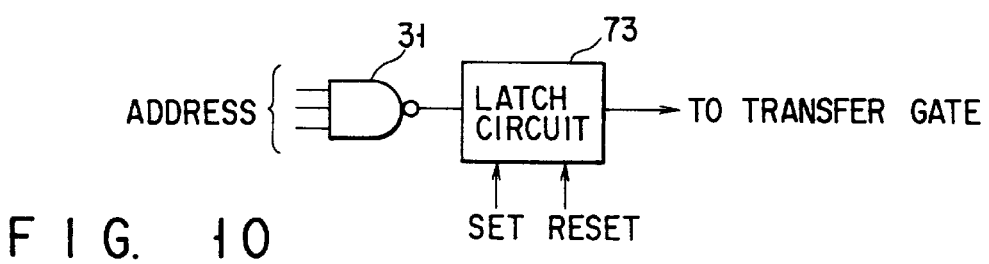
FIG. 10 is a circuit diagram showing a constitution of an EEPROM according to a third embodiment of the present invention.

FIG. 10 is a circuit diagram showing a constitution of part of the main decoder circuit of an EEPROM according to a third embodiment of the present invention. In the third embodiment, if, as shown in FIG. 10, a latch circuit 73 controlled in response to a set signal SET and a reset signal RESET is arranged on the output side of the NAND gate 31 in the main decoder circuit shown in FIG. 3, and the latch circuit 73 is set to erase data before the data is actually erased, the data can be erased by applying negative voltages to an arbitrary number of word lines 12 at the same time.

As described above, in the nonvolatile semiconductor memory device according to the present invention, the constitution of the row decoder circuit can be made simpler than that of the row decoder circuit of the conventional device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory device comprising:

a memory cell array including memory cells arranged in rows and columns, each memory cell including a transistor having first and second terminals and a gate and being capable of electrically erasing and rewriting data;

word lines each connecting the transistor gates of the memory cells in a respective corresponding row of said memory cell array;

bit lines each connecting the first terminals of the transistors of the memory cells in a respective corresponding column of said memory cell array;

a first predecoder circuit, having a plurality of output terminals, for selecting one of said output terminals in accordance with first partial address information, said first predecoder circuit including first predecoder circuit portions provided in correspondence to said output terminals, each first predecoder circuit portion including a decoder circuit and first and second level conversion circuits, said decoder circuit receiving the first partial address information and a signal indicative of a data erase mode; decoding the first partial address information; and outputting a decode signal in response to the signal indicative of the data erase mode, said first level conversion circuit receiving the decode signal from said decoder circuit, a first logic high level voltage, and a first logic low level voltage; level-converting the decode signal based on the respective levels of the first logic high level voltage and the first logic low level voltage; and outputting the level-converted decode signal as a first signal;

said second level conversion circuit receiving the first signal output from said first level conversion circuit, a first voltage having a positive value as a second logic high level voltage, and a second voltage having a negative value in the data erase mode as a second logic low level voltage; level-converting the first signal based on the respective levels of the second logic high level voltage and the second logic low level voltage; and outputting the level-converted first signal to the corresponding output terminal, whereby said first predecoder circuit outputs the second voltage from the output terminal selected by the first partial address information in the data erase mode and outputs the first voltage from each non-selected output terminal in the data erase mode;

a voltage node to which the first voltage is applied in the data erase mode and to which a third voltage, which is higher than the second voltage and lower than the first voltage, is applied in modes other than the data erase mode;

first switches, each first switch connected between a corresponding one of said word lines and a corresponding one of said output terminals of said first predecoder circuit;

second switches, each second switch connected between a corresponding one of said word lines and said voltage node; and a switch control circuit for selecting and switching on said first switches and said second switches in accordance with second partial address information which is different than the first partial address information.

2. The nonvolatile semiconductor memory device according to claim 1, wherein each first switch includes a first N-channel MOS transistor and a first P-channel MOS transistor arranged in parallel, and each second switch includes a second N-channel MOS transistor and a second P-channel MOS transistor arranged in parallel.

3. The nonvolatile semiconductor memory device according to claim 1, wherein said first predecoder circuit outputs a fourth voltage, which is higher than the first voltage, from the selected output terminal and outputs the third voltage from each non-selected output terminal in a data write mode; and said first predecoder circuit outputs a fifth voltage, which is higher than the first voltage and lower than the fourth voltage, from the selected output terminal and outputs the third voltage from each non-selected output terminal in a data read mode.

4. The nonvolatile semiconductor memory device according to claim 1, wherein said switch control circuit includes a second predecoder circuit for decoding the second partial address information, and control signal generating circuits for decoding an output signal of said second predecoder circuit and generating control signals for controlling the ON/OFF switching of said first switches and said second switches.

5. The nonvolatile semiconductor memory device according to claim 1, further comprising:

a read voltage selecting circuit for selecting a read voltage which is applied to said plurality of bit lines in a data read mode.

6. The nonvolatile semiconductor memory device according to claim 1, further comprising:

a source voltage selecting circuit for selecting a source voltage which is applied to the sources of the memory cells in said memory cell array.

7. The nonvolatile semiconductor memory device according to claim 6, wherein said source voltage selecting circuit selects different voltages in the data erase mode, a data write mode, and a data read mode.

8. The nonvolatile semiconductor memory device according to claim 7, wherein the memory cells in said memory cell array are grouped into blocks, the sources of the memory cells in each of said blocks are connected in common to one another, and the source voltages selected from said source voltage selecting circuit are applied to the connected sources of the memory cells.

9. A nonvolatile semiconductor memory device comprising:

a memory cell array including memory cells arranged in rows and columns, each memory cell including a transistor having first and second terminals and a gate and being capable of electrically erasing and rewriting data;

word lines each connecting the transistor gates of the memory cells in a respective corresponding row of said memory cell array;

bit lines each connecting the first terminals of the transistors of the memory cells in a respective corresponding column of said memory cell array;

a voltage node to which a voltage of 0 V or more is applied in a data erase mode and to which a first logic low level voltage is applied in modes other than the data erase mode;

a predecoder circuit, having a plurality of output terminals, for selecting one of said output terminals in accordance with first partial address information, said predecoder circuit including a plurality of predecoder circuit portions provided in correspondence to said output terminals, each predecoder circuit portion including a decoder circuit and first and second level conversion circuits, said decoder circuit receiving the first partial address information and a signal indicative of a data erase mode; decoding the first partial address information; and outputting a decode signal in response to the signal indicative of the data erase mode, said first level conversion circuit receiving the decode signal from said decoder circuit, a first logic high level voltage, and a second logic low level voltage; level-converting the decode signal based on the respective levels of the first logic high level voltage and the second logic low level voltage; and outputting the level-converted decode signal as a first signal, said second level conversion circuit receiving the first signal output by said first level conversion circuit, a first voltage having a positive value as a second logic high level voltage, and a second voltage having a negative value in the data erase mode as a third logic low level voltage; level-converting the first signal based on the respective levels of the second logic high level voltage and the third logic low level voltage; and outputting the level-converted first signal to the corresponding output terminal, whereby said predecoder circuit outputs the second voltage from the output terminal selected by the first partial address information in the data erase mode and outputs the first voltage from each non-selected output terminal in the data erase mode;

transistor groups arranged in correspondence with said word lines, each transistor group comprising first and second N-channel MOS transistors and first and second P-channel MOS transistors each having first and second terminals and a gate, the first terminal of said first N-channel MOS transistor being connected to the corresponding word line, the second terminal of said first N-channel MOS transistor being connected to a corresponding output terminal of said predecoder circuit, and the gate of said first N-channel MOS transistor being supplied with a first logic signal;

the first terminal of said second N-channel MOS transistor being connected to the corresponding word line, the second terminal of said first N-channel MOS transistor being connected to said voltage node, and the gate of said second N-channel MOS transistor being supplied with a second logic signal;

said first P-channel MOS transistor being connected in parallel with said first N-channel MOS transistor, and the gate of said first P-channel MOS transistor being supplied with the second logic signal; and said second P-channel MOS transistor being connected in parallel with said second N-channel MOS transistor, and the gate of said second P-channel MOS transistor being supplied with the first logic signal.

10. The nonvolatile semiconductor memory device according to claim 9, further comprising:

a source voltage selecting circuit for selecting a source voltage which is applied to the sources of the memory cells in said memory cell array.

11. The nonvolatile semiconductor memory device according to claim 10, wherein said source voltage selecting circuit selects different voltages in the data erase mode, a data write mode, and a data read mode.

12. The nonvolatile semiconductor memory device according to claim 11, wherein the memory cells in said memory cell array are grouped into blocks, the sources of the memory cells in each of said blocks are connected in common to one another, and the source voltages selected from said source voltage selecting circuit are applied to the connected sources of the memory cells.

13. A nonvolatile semiconductor memory device comprising:

a memory cell array including memory cells arranged in rows and columns, each memory cell including a transistor having first and second terminals and a gate and being capable of electrically erasing and rewriting data;

word lines each connecting the transistor gates of the memory cells in a respective corresponding row of said memory cell array;

bit lines each connecting the first terminals of the transistors of the memory cells in a respective corresponding column of said memory cell array;

a first voltage node to which a negative voltage is applied in a data erase mode and to which a voltage of 0 V is applied in modes other than the data erase mode;

a second voltage node to which a voltage of 0 V or more is applied;

a predecoder circuit, having a plurality of output terminals, for selecting one of said output terminals in accordance with first partial address information, said predecoder circuit including a plurality of predecoder circuit portions provided in correspondence with said output terminals, each predecoder circuit portion including a decoder circuit and first and second level conversion circuits, said decoder circuit receiving the first partial address information and a signal indicative of a data erase mode; decoding the first partial address information; and outputting a decode signal in response to the signal indicative of the data erase mode, said first level conversion circuit receiving the decode signal from said first decoder circuit, a first logic high level voltage, and a first logic low level voltage; level-converting the decode signal based on the respective levels of the first logic high level voltage and the first logic low level voltage; and outputting the level-converted decode signal as a first signal, said second level conversion circuit receiving the first signal output by said first level conversion circuit, a first voltage having a positive value as a second logic high level voltage, and a second voltage having a negative value in the data erase mode as a second logic low level voltage, level-converting the first signal based on the respective levels of the second logic high level voltage and the second logic low level voltage; and outputting the level-converted first signal to the corresponding output terminal, whereby said predecoder circuit outputs the second voltage from the output terminal selected by the first partial address information in the data erase mode and outputs the first voltage from each non-selected output terminal in the data erase mode;

transistor groups arranged in correspondence with said word lines, each transistor group comprising first and second N-channel MOS transistors and first and second P-channel MOS transistors each having first and second terminals and a gate, the first terminal of said first N-channel MOS transistor being connected to the corresponding word line, the second terminal of said first N-channel MOS transistor being connected to a corresponding output terminal of said predecoder circuit, and the gate of said first N-channel MOS transistor being supplied with a first logic signal;

the first terminal of said second N-channel MOS transistor being connected to the corresponding word line, the second terminal of said second N-channel MOS transistor being connected to said first voltage node, and the gate of said second N-channel MOS transistor being supplied with a second logic signal;

said first P-channel MOS transistor being connected in parallel with said first N-channel MOS transistor, and the gate of said first P-channel MOS transistor being supplied with the second logic signal; and the first terminal of said second P-channel MOS transistor being connected to the corresponding word line, the second terminal of said second P-channel MOS transistor connected to said second voltage node, and the gate of said second P-channel MOS transistor being supplied with the first logic signal.

14. The nonvolatile semiconductor memory device according to claim 13, further comprising:
a source voltage selecting circuit for selecting a source voltage which is applied to the sources of the memory cells in said memory cell array.

15. The nonvolatile semiconductor memory device according to claim 14, wherein said source voltage selecting circuit selects different voltages in the data erase mode, a data write mode, and a data read mode.

16. The nonvolatile semiconductor memory device according to claim 15, wherein the memory cells in said memory cell array are grouped into blocks, the sources of the memory cells in each of said blocks are connected in common to one another, and the source voltages selected by said source voltage selecting circuit are applied to the connected sources of the memory cells.

17. A nonvolatile semiconductor memory device comprising:
a memory cell array including memory cells arranged in rows and columns, each memory cell including a transistor having first and second terminals and a gate and being capable of electrically erasing and rewriting data;

word lines each connecting the transistor gates of the memory cells in a respective corresponding row of said memory cell array;

bit lines each connecting the first terminals of the transistors of the memory cells in a respective corresponding column of said memory cell array;

a predecoder circuit, having a plurality of output terminals, for selecting one of said output terminals in accordance with first partial address information, said predecoder circuit including predecoder circuit portions provided in correspondence to said output terminals, each predecoder circuit portion comprising a decoder circuit and first and second level conversion circuits, said decoder circuit receiving the first partial address information and a signal indicative of a data erase mode; decoding the first partial address information; and outputting a decode signal in response to the signal indicative of the data erase mode, said first level conversion circuit receiving the decode signal from said first decoder circuit, a first logic high level voltage, and a first logic low level voltage; level-converting the decode signal based on the respective levels of the first logic high level voltage and the first logic low level voltage; and outputting the level-converted decode signal as a first signal;

said second level conversion circuit receiving the first signal output by said first level conversion circuit, a first voltage having a voltage of 0 V or more as a second logic high level voltage, and a second voltage having a negative value in the data erase mode as a second logic low level voltage; level-converting the first signal based on the respective levels of the second logic high level voltage and the second logic low level voltage; and outputting the level-converted first signal to the corresponding output terminal, whereby said predecoder circuit outputs the second voltage from the output terminal selected by the first partial address information in the data erase mode and outputs the first voltage from each non-selected output terminal in the data erase mode;

a voltage node to which the first voltage is applied in the data erase mode and to which a third voltage, which is higher than the second voltage and lower than the first voltage, is applied in modes other than the data erase mode;

first switches, each first switch connected between a corresponding one of said word lines and a corresponding one of said output terminals of said first predecoder circuit;

second switches, each second switch connected between a corresponding one of said word lines and the voltage node; and a switch control circuit for selecting and switching on said first switches and said second switches in accordance with second partial address information which is different than the first partial address information.

18. A nonvolatile semiconductor memory device comprising:
a memory cell array including memory cells arranged in rows and columns, each memory cell including a transistor having a source, a drain, and a gate and being capable of electrically erasing and rewriting data;

word lines each connecting the transistor gates of the memory cells in a respective corresponding row of said memory cell array;

bit lines each connecting the transistor drains of the memory cells in a respective corresponding column of said memory cell array;

a first predecoder circuit, having a plurality of output terminals, for selecting one of said output terminals in accordance with first partial address information, outputting a first voltage having a negative value from the selected output terminal in the data erase mode, and outputting a second voltage having a positive value from each non-selected output terminal in the data erase mode;

a voltage node to which the second voltage is applied in the data erase mode and to which a third voltage, which is lower than the second voltage and higher than the first voltage, is applied in modes other than the data erase mode;

first switches, each first switch connected between a corresponding one of said word lines and a corresponding one of said output terminals of said first predecoder circuit;

second switches, each second switch connected between a corresponding one of said word lines and said voltage node; and a switch control circuit for complementarily switching on and off said first switches and said second switches in accordance with second partial address information which is different than the first partial address information, wherein the first and second switches coupled to same word line are complementarily switched on and off in response to the same control signal supplied to control terminals thereof.

19. The nonvolatile semiconductor memory device according to claim 18, wherein each first switch includes an N-channel MOS transistor having a source-to-drain current path and a gate and a P-channel MOS transistor having a source-to-drain current path arranged in parallel to the source-to-drain current path of the N-channel MOS transistor, and each second switch includes an N-channel MOS transistor having a source-to-drain current path and a gate and a P-channel MOS transistor having a source-to-drain current path arranged in parallel to the N-channel MOS transistor.

20. The nonvolatile semiconductor memory device according to claim 18, wherein said first predecoder circuit selects one of said output terminals in accordance with the first partial address information;

said first predecoder circuit outputs the first voltage from the selected output terminal and outputs the second voltage from each non-selected output terminal in the data erase mode;

said first predecoder circuit outputs a fourth voltage, which is higher than the second voltage, from the selected output terminal and outputs the third voltage from each non-selected output terminal in a data write mode; and said first predecoder circuit outputs a fifth voltage, which is higher than the second voltage and lower than the fourth voltage, from the selected output terminal and outputs the third voltage from each non-selected output terminal in a data read mode.

21. The nonvolatile semiconductor memory device according to claim 18, wherein said first predecoder circuit includes decode/level conversion circuits which are equal in number to the output terminals of said first predecoder circuit, said first partial address information supplied to said first predecoder circuit includes address signals whose logic high levels are set to the fifth voltage and whose logic low levels are set to the third voltage, and each of said decode/level conversion circuits includes:

a decoder circuit for decoding said address signals;

an output control circuit for generating an output signal of said decoder circuit; and level conversion circuits for converting a logic high level voltage of the output signal generated by said output control circuit into the second voltage, the fourth voltage, and the fifth voltage in the data erase mode, in the data write mode, and in the data read mode, respectively, and for converting a logic low level voltage of the output signal generated by said output control circuit into the first voltage and the third voltage in the data erase mode and the modes other than the data erase mode, respectively.

22. The nonvolatile semiconductor memory device according to claim 18, wherein said switch control circuit includes a second predecoder circuit for decoding the second partial address information, and control signal generating circuits for decoding an output signal of said second predecoder circuit and generating the control signals for controlling the switching on and off of said first switches and said second switches.

23. The nonvolatile semiconductor memory device according to claim 18, further comprising a read voltage selecting circuit for selecting a read voltage which is applied to said plurality of bit lines in the data read mode.

24. The nonvolatile semiconductor memory device according to claim 18, further comprising a source voltage selecting circuit for selecting a source voltage which is applied to the sources of the memory cells in said memory cell array.

25. The nonvolatile semiconductor memory device according to claim 24, wherein said source voltage selecting circuit selects different voltages in the data erase mode, the data write mode, and the data read mode.

26. The nonvolatile semiconductor memory device according to claim 25, wherein the memory cells in said memory cell array are grouped into blocks, sources of the memory cells in each of said blocks are connected in common to one another, and the source voltages selected from said source voltage selecting circuit are applied to the connected sources of the memory cells.

27. A nonvolatile semiconductor memory device comprising:

a memory cell array including memory cells arranged in rows and columns, each memory cell including a transistor having a source, a drain, and a gate and being capable of electrically erasing and rewriting data;

word lines each connecting the transistor gates of the memory cells in a respective corresponding row of said memory cell array;

bit lines each connecting the transistor drains of the memory cells in a respective corresponding column of said memory cell array;

a voltage node to which a voltage of 0 V or more is applied in a data erase mode and to which a logic low level voltage is applied in modes other than the data erase mode;

a predecoder circuit, having output terminals which are equal in number to said word lines, for selecting one output terminal in accordance with address information, outputting logic high level voltages from the selected output terminal in data read and write modes, outputting a negative voltage from the selected output terminal in the data erase mode, outputting logic low level voltages from non-selected output terminals in the data read and write modes, and outputting a logic high level voltage from non-selected output terminals in the data erase mode; and transistor groups arranged in correspondence with said word lines, each transistor group comprising first and second N-channel MOS transistors and first and second P-channel MOS transistors each having a source, a drain, and a gate, one of the source and drain of said first N-channel MOS transistor being connected to the corresponding word line, the other of the source and drain of said first N-channel MOS transistor being connected to a corresponding output terminal of said predecoder circuit, and the gate of said first N-channel MOS transistor being supplied with a first logic signal;

one of the source and drain of said second N-channel MOS transistor being connected to the corresponding word line, the other of the source and drain of said second N-channel MOS transistor being connected to said voltage node, and the gate of said second N-channel MOS transistor being supplied with a second logic signal which is opposite to the first logic signal;

said first P-channel MOS transistor being connected in parallel with said first N-channel MOS transistor, and the gate of said first P-channel MOS transistor being supplied with the second logic signal; and said second P-channel MOS transistor being connected in parallel with said second N-channel MOS transistor, and the gate of said second P-channel MOS transistor being supplied with the first logic signal.

28. The nonvolatile semiconductor memory device according to claim 27, further comprising a source voltage selecting circuit for selecting a source voltage which is applied to the sources of the memory cells in said memory cell array.

29. The nonvolatile semiconductor memory device according to claim 28, wherein said source voltage selecting circuit selects different voltages in the data erase mode, data write mode, and data read mode.

30. The nonvolatile semiconductor memory device according to claim 29, wherein the memory cells in said memory cell array are grouped into blocks, sources of the memory cells in each of the blocks are connected in common to one another, and the source voltages selected from said source voltage selecting circuit are applied to the connected sources of the memory cells.

31. A nonvolatile semiconductor memory device comprising:

a memory cell array including memory cells arranged in rows and columns, each memory cell including a transistor having a source, a drain, and a gate and being capable of electrically erasing and rewriting data;

word lines each connecting the transistor gates of the memory cells in a respective corresponding row of said memory cell array;

bit lines each connecting the transistor drains of the memory cells in a respective corresponding column of said memory cell array;

a first voltage node to which a negative voltage is applied in a data erase mode and to which a voltage of 0 V is applied in modes other than the data erase mode;

a second voltage node to which a voltage of 0 V or more is applied;

a predecoder circuit, having output terminals which are equal in number to said word lines, for selecting one of said output terminals in accordance with address information, outputting logic high level voltages from the selected output terminal in data read and write modes, outputting a negative voltage from the selected output terminal in the data erase mode, outputting logic low level voltages from non-selected output terminals in the data read and write modes, and outputting a logic high level voltage from non-selected output terminals in the data erase mode;

transistor groups arranged in correspondence with word lines, each transistor group comprising first and second N-channel MOS transistors and first and second P-channel MOS transistors each having a source, a drain, and a gate, one of the source and the drain of said first N-channel MOS transistor being connected to the corresponding word line, the other of the source and drain of said first N-channel MOS transistor being connected to a corresponding output terminal of said predecoder circuit, and the gate of said first N-channel MOS transistor being supplied with a first logic signal;

one of the source and drain of said second N-channel MOS transistor being connected to the corresponding word line, the other of the source and drain of said second N-channel MOS transistor being connected to said first voltage node, and the gate of said second N-channel MOS transistor being supplied with a second logic signal which is opposite to the first logic signal;

said first P-channel MOS transistor being connected in parallel with said first N-channel MOS transistor, and the gate of said first P-channel MOS transistor being supplied with the second logic signal; and one of the source and drain of said second P-channel MOS transistor being connected to the corresponding word line, the other of the source and drain of said second P-channel MOS transistor being connected to said second voltage node, and the gate of said second P-channel MOS transistor being supplied with the first logic signal.

32. The nonvolatile semiconductor memory device according to claim 31, further comprising a source voltage selecting circuit for selecting a source voltage which is applied to the sources of the memory cells in said memory cell array.

33. The nonvolatile semiconductor memory device according to claim 31, wherein said source voltage selecting circuit selects different voltages in the data erase mode, data write mode, and data read mode.

34. The nonvolatile semiconductor memory device according to claim 33, wherein the memory cells in said memory cell array are grouped into blocks, sources of the memory cells in each of the blocks are connected in common to one another, and the source voltages selected from said source voltage selecting circuit are applied to the connected sources of the memory cells.

35. A nonvolatile semiconductor memory device comprising:

a memory cell array including nonvolatile memory cells arranged in rows and columns, each memory cell including a transistor having first and second terminals and a gate;

word lines each connecting the transistor gates of the memory cells in a respective corresponding row of said memory cell array;

bit lines each connecting the first terminals of the transistors of the memory cells in a respective corresponding column of said memory cell array;

a voltage node to which a voltage of 0 V or more is applied in a data erase mode and to which a logic low level voltage is applied in modes other than the data erase mode;

a predecoder circuit, having a plurality of output terminals, for selecting one of said output terminals in accordance with first partial address information, outputting a voltage having a negative value from the selected output terminal in the data erase mode, and outputting a voltage of 0 V or more from each non-selected output terminal in the data erase mode;

first switches, each first switch connected between a corresponding one of said word lines and a corresponding one of said output terminals of said predecoder circuit;

second switches, each second switch connected between a corresponding one of said word lines and said voltage node; and a switch control circuit for complementarily switching on and off said first switches and said second switches in accordance with second partial address information which is different that the first partial address information, wherein the first and second switches coupled to the same word line are complementarily switched on and off in response to the same control signal supplied to control terminals thereof.

36. A nonvolatile semiconductor memory device comprising:

a memory cell array including nonvolatile memory cells arranged in rows and columns, each memory cell including a transistor having first and second terminals and a gate;

word lines each connecting the transistor gates of the memory cells in a respective corresponding row of said memory cell array;

bit lines each connecting the first terminals of the transistors of the memory cells in a respective corresponding column of said memory cell array;

a voltage node to which a voltage of 0 V or more is applied in a data erase mode and to which a logic low level voltage is applied in modes other than the data erase mode;

a first predecoder circuit, having a plurality of output terminals, for selecting said output terminals in accordance with first partial address information, outputting a voltage having a negative value from the selected output terminals in the data erase mode, and outputting a voltage of 0 V or more from each non-selected output terminal in the data erase mode;

a main decoder circuit comprising main decoder circuit portions each connected to the word lines of a corresponding word line group, wherein each main decoder circuit portion comprises:

first switches each connected between one of the word lines of the corresponding word line group and a corresponding one of said output terminals of said first predecoder circuit; and second switches each connected between one of the word lines of the corresponding word line group and said voltage node;

a control signal generating circuit for controlling the ON/OFF switching of said first and second switches; and a second predecoder circuit responsive to second partial address information for generating output signals for controlling the control signal generating circuits of said main decoder circuit portions, wherein in the data erase mode, the output signals of said second predecoder circuit cause a switching ON of the first switches and a switching OFF of the second switches of any main decoder circuit portion connected to a word line group including one or more word lines selected during the data erase mode.

37. The nonvolatile semiconductor memory device according to claim 36, wherein, in the data erase mode, the output signals of said second predecoder circuit cause a switching OFF of the first switches and a switching ON of the second switches of any main decoder circuit portion connected to a word line group including no word lines selected during the data erase mode.

38. The nonvolatile semiconductor memory device according to claim 36, further comprising:

latch circuits arranged between said control signal generating circuits and said first and second switches of said main decoder circuit portions.

39. A nonvolatile semiconductor memory device comprising:

a memory cell array including memory cells arranged in rows and columns, each memory cell including a transistor having a source, a drain, and a gate and being capable of electrically erasing and rewriting data;

word lines each connecting the transistor gates of the memory cells in a respective corresponding row of said memory cell array;

bit lines each connecting the transistor drains of the memory cells in a respective corresponding column of said memory cell array;

a first predecoder circuit, having a plurality of output terminals, for selecting one of said output terminals in accordance with first partial address information, outputting a first voltage having a negative value from the selected output terminal in the data erase mode, and outputting a second voltage having a positive value from each non-selected output terminal in the data erase mode;

a first voltage node to which the second voltage is applied in the data erase mode and to which a third voltage, which is lower than the second voltage and higher than the first voltage, is applied in modes other than the data erase mode;

first switches, each first switch connected between a corresponding one of said word lines and a corresponding one of said output terminals of said first predecoder circuit;

second switches, each second switch connected between a corresponding one of said word lines and a second voltage node; and a switch control circuit for selecting and switching on said first switches and said second switches in accordance with second partial address information which is different than the first partial address information, wherein each first switch includes an N-channel MOS transistor having a source-to-drain current path and a gate and a P-channel MOS transistor having a source-to-drain current path arranged in parallel to the source-to-drain current path of the N-channel MOS transistor, and each second switch includes an N-channel MOS transistor having a source-to-drain current path and a gate and a P-channel MOS transistor having a source-to-drain current path arranged in parallel to the N-channel MOS transistor.

* * * * *